(12) United States Patent
Preusse et al.

(10) Patent No.: US 7,358,716 B2
(45) Date of Patent: Apr. 15, 2008

(54) MEASURING METHOD AND MEASURING ARRANGEMENT FOR MEASURING CURRENTS WITH A LARGE DYNAMIC RANGE

(75) Inventors: Norbert Preusse, Alzenau (DE); Stefan Schaefer, Ruemmelsheim (DE); Friedrich Lenhard, Hanau (DE)

(73) Assignee: Vacuumschmelze GmbH & Co. KG, Hanau (DE)

( * ) Notice: Subject to any disclaimer, the term of this patent is extended or adjusted under 35 U.S.C. 154(b) by 84 days.

(21) Appl. No.: 11/330,603

(22) Filed: Jan. 12, 2006

(65) Prior Publication Data

US 2006/0158176 A1 Jul. 20, 2006

Related U.S. Application Data

(63) Continuation of application No. PCT/EP2004/007420, filed on Jul. 7, 2004.

(30) Foreign Application Priority Data

Jul. 14, 2003 (DE) ................. 103 31 883

(51) Int. Cl.
*G01R 33/00* (2006.01)
(52) U.S. Cl. ................... 324/117 R; 324/127
(58) Field of Classification Search .............. None
See application file for complete search history.

(56) References Cited

U.S. PATENT DOCUMENTS

| | | | |
|---|---|---|---|
| 5,309,086 A * | 5/1994 | Johansson et al. ...... | 324/117 R |
| 5,565,765 A * | 10/1996 | Lenhard ................ | 324/117 R |
| 5,734,264 A * | 3/1998 | Berna et al. ............ | 324/117 H |
| 5,922,143 A | 7/1999 | Verin et al. ............. | 148/108 |
| 6,218,825 B1 | 4/2001 | Lenhard ............... | 324/117 R |
| 6,388,549 B1 | 5/2002 | Lenhard ............... | 336/200 |

(Continued)

FOREIGN PATENT DOCUMENTS

DE 33 24 224 C2 12/1984

(Continued)

OTHER PUBLICATIONS

International Pct Search Report, PCT/EP2004/007420, published Jan. 20, 2005, pp. 1-9.*

(Continued)

*Primary Examiner*—Ernest Karlsen
(74) *Attorney, Agent, or Firm*—Baker Botts L.L.P.

(57) ABSTRACT

A measuring method for measuring currents with a large dynamic range by means of a magnetic measuring module has the steps of switching into a high-current mode when a current threshold value is exceeded, and switching into a low-current mode otherwise, wherein the low-current mode has the following steps:—Feeding a first current pulse to a compensation coil, which drives a magnetic core in a first direction until magnetic saturation occurs,—measuring a first primary current value $I_1$ after the current pulse is disconnected,—feeding a second current pulse to the compensation coil, which drives the magnetic core in a counter second direction until magnetic saturation occurs,—measuring a second primary current value $I_2$ after the second current pulse is disconnected,—determining the corrected primary current value subsequently as an average value $I=(I_1+I_2)/2$ from the first and the second primary current values.

20 Claims, 6 Drawing Sheets

U.S. PATENT DOCUMENTS 6,897,758 B1     5/2005     Baumgaertl et al. ........ 336/175

FOREIGN PATENT DOCUMENTS

| | | |
|---|---|---|
| DE | 42 02 296 A1 | 8/1992 |
| DE | 42 29 948 A1 | 3/1994 |
| DE | 42 30 939 A1 | 3/1994 |
| DE | 197 36 602 A1 | 3/1999 |
| DE | 198 45 778 A1 | 4/2000 |
| DE | 100 40 879 A1 | 3/2002 |
| EP | 0 294 590 B1 | 5/1988 |
| EP | 0 844 628 B1 | 10/1997 |
| EP | 0 960 342 B1 | 2/1998 |
| EP | 1 010 014 B1 | 5/1998 |
| GB | 2 252 419 A | 1/1992 |
| WO | 1997/42510 | 11/1997 |
| WO | 2002/071081 A1 | 9/2002 |
| WO | 2005/005998 A1 | 2/2005 |

OTHER PUBLICATIONS

PCT Search Report from PCT/EP2004/007420, Oct. 25, 2004.
En Route to the Car of the Future (1 page), 2005.

* cited by examiner

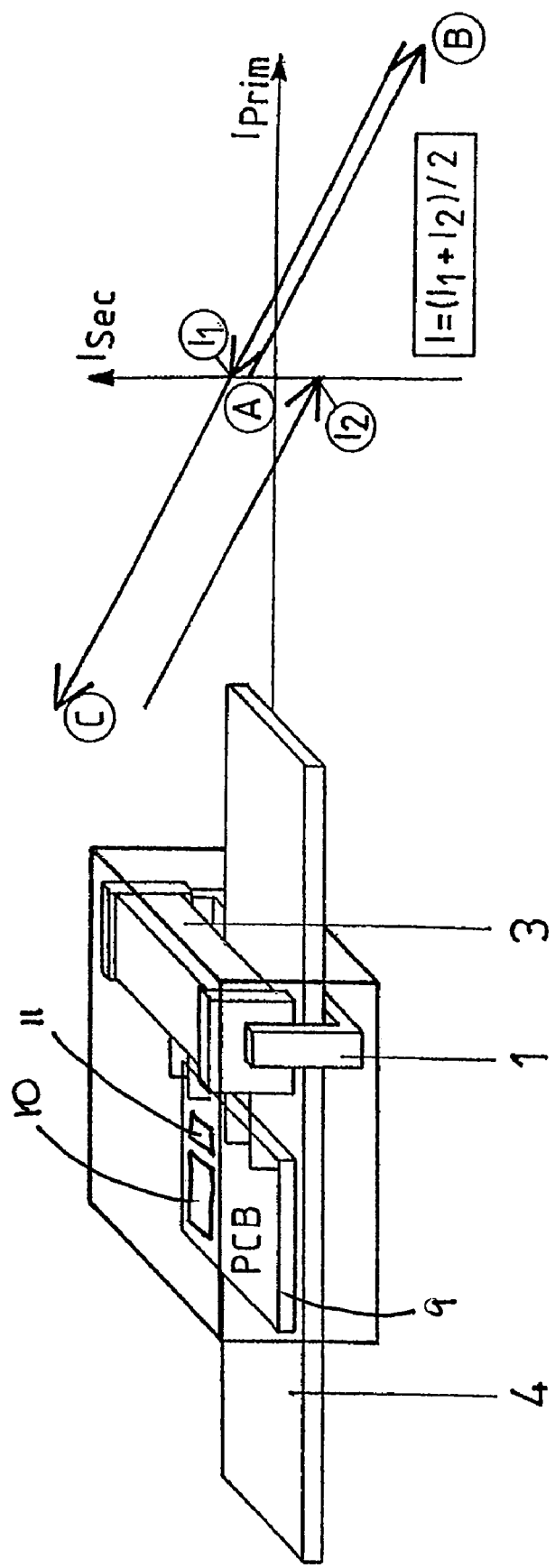

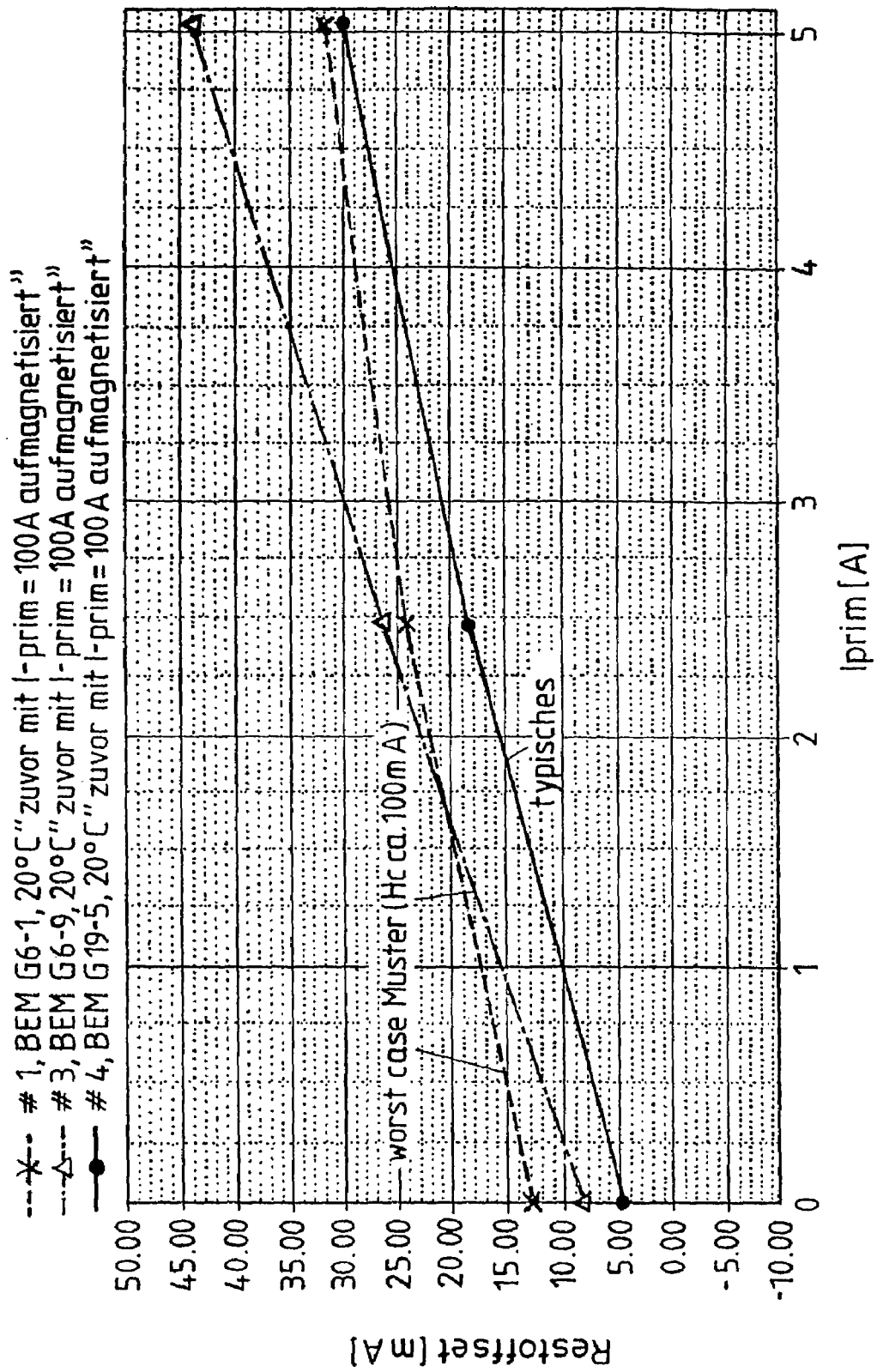

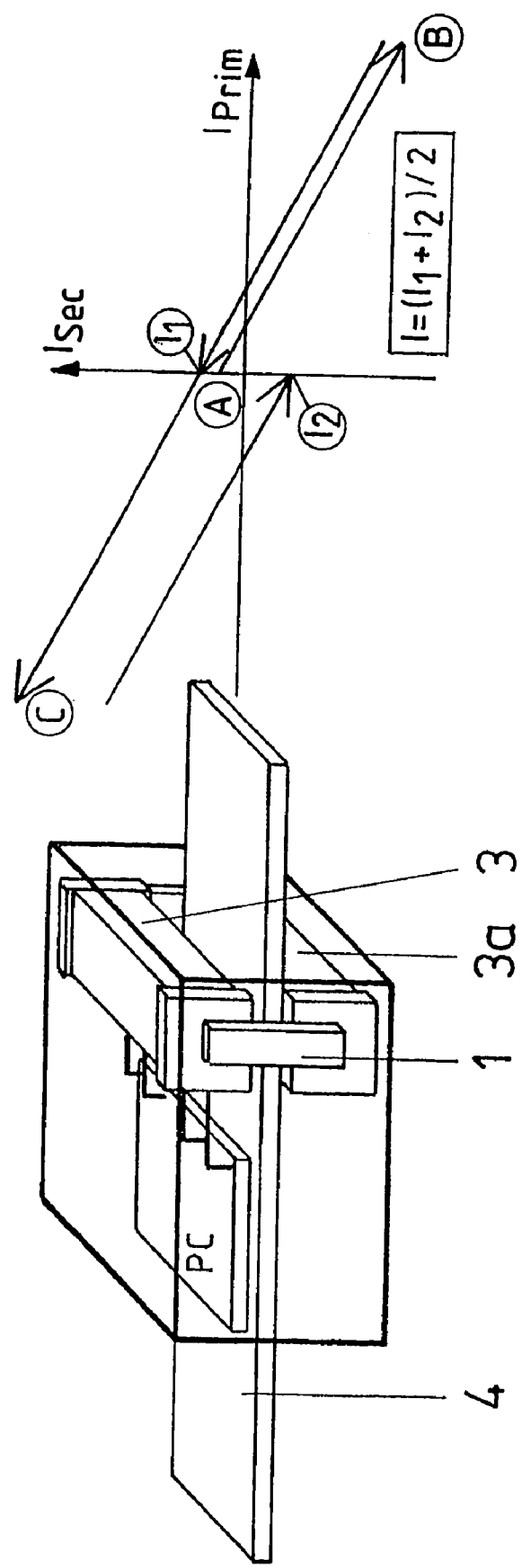

MEASURING METHOD AND MEASURING ARRANGEMENT FOR MEASURING CURRENTS WITH A LARGE DYNAMIC RANGE

CROSS-REFERENCE TO RELATED APPLICATION

This application is a continuation of co-pending International Application No. PCT/EP2004/007420 filed Jul. 7, 2004 which designates the United States, and claims priority to German application number DE 103 31 883.6 filed Jul. 14, 2003, which are incorporated herein by reference in their entirety.

TECHNICAL FIELD

The present invention relates to a measuring method and a measuring arrangement for measuring currents with a large dynamic range, particularly, for measuring the battery current in a motor vehicle.

BACKGROUND

With the increasing current consumption in motor vehicles, such type of measuring arrangements (current sensors) and measuring methods are increasingly indispensable since the state parameters of the battery must be determined at every point in time by continuously measuring the battery current. Parameters such as, for example, "State of Health," "State of Charge" or "State of Function" are intended to enable a differentiated statement about the functional capability of the battery in all operating conditions possible. These state parameters thus form the basis for an intelligent battery-energy management in the vehicle.

In individual vehicles, such measuring systems are already in use since 2001 and are described, for example in the article by Achim Scharf, "En Route to the Car of the Future," "Power Electronics Europe Magazine," issue Apr. 4, 2001. These systems are still very expensive and consist of a large control unit in which all the calculations are carried out on the basis of a stored battery model. Furthermore, the control unit also controls a large part of the actions derived from these calculations in the vehicle electrical system. A current sensor is integrated into this control device. The battery cable is guided though the control unit in such a way that the current can be measured in the control unit.

The costs of the solution described above are by far too high for a widespread use of battery management systems. Therefore, increasingly more manufacturers are changing their designs to use control units existing inside the vehicle electrical system for the calculations from the battery model and the control functions derived therefrom. Presently, in every vehicle there already exist several control units, which comprise a microprocessor of high computing power. Therefore in order to integrate said control functions into such a control unit, the existing microprocessor must at best be replaced by a one that is slightly more powerful. The corresponding additional costs are considerably lower than those for an additional control unit. The corresponding designs then require an extremely cost-effective current measuring module which is attached to the battery, to the pole shoe of the battery or to the battery cable and at all times provides the vehicle electrical system with information about the actually flowing battery current using a standardized interface (e.g. CAN bus).

Extremely high demands are made on this current measurement due to the fact that on the one hand currents in the range of 1000 A can temporarily flow during start-up at low temperatures. On the other hand in case of a parked vehicle, current flowing in the range of few 10 mA contributes considerably to the loss of charge of the battery over long periods of time and hence must be measured with sufficient precision. No classic current sensor is in a position to detect this dynamic range of a few mA to 1000 A with sufficient precision.

Current sensors, which are in a position to detect currents over a large dynamic range with a precision of 1% or higher are closed, loop sensors. A typical embodiment of such a sensor is illustrated in FIG. 1. It contains a magnetic core provided with an air gap. A magnetic field probe 2 is arranged in the air gap of the magnetic core. Said probe converts the magnetic field in the air gap into an electric signal which controls the current through a compensation coil 3 that is wound on the core preferably in the region of the magnetic field probe. A primary conductor 4 whose current is to be measured is guided through the magnetic core. The control electronics of the current sensor ensures that the magnetic flux supplied to the magnetic core using the current of the primary conductor is compensated at all times by the field of the compensation coil. The target value of the control circuit to be registered by the magnetic field probe is thus of zero field strength. The magnetic field probe operates as a zero field detector. In the compensated state, the current through the compensation coil $I_{komp}$ is directly proportional to the current to be measured $I_{Prim}$. If the compensation coil N has windings, then the equation $I_{Prim} = N \, I_{komp}$ holds true.

The magnetic field probe 2 ought to have a very small, preferably vanishing offset. Offset refers to the output signal of the probe when zero magnetic fields are present. If the probe signal in this case also is not zero, the probe has an offset that causes a distinct error of the sensor in the range of small currents.

A Hall IC can be used as a magnetic field probe. Hall ICs normally have a very distinct offset that can lead to measurement errors of the current sensor in the range of 0.5 A. However, it is possible to largely eliminate this offset using electronic measures on the Hall IC or by calibrating the current sensor.

The use of a magnetic probe, for example according to the patent application EP 0 294 590 is easier and more precise, especially when it comes to the temperature-dependence of the current sensor. Since the evaluation electronics scans the symmetry of a soft-magnetic metal strip, this magnetic field probe operates as a zero field detector in a practically offset-free and temperature-independent manner. Such a sensor is indicated schematically in FIG. 1 as a magnetic field sensor 2.

Furthermore, a magnetic core 1, which is used according to the patent application EP 0 294 590 in combination with a magnetic probe, is preferably composed according to the patent application EP 1 010 014 of two or more parts, which are joined together in a partly overlapping manner and which have a pocket in the region of the air gap for the magnetic field probe 2. The current sensor can thus be mounted by assembling the core over randomly shaped conductors and the probe is protected from external interfering magnetic field influences.

The hysteresis characteristics of the magnetic core 1 determine the precision of such a current sensor in the range of small currents, provided that the magnetic field probe 2 has no offset. The magnetization curves of practically every soft-magnetic material, especially the magnetization curve of NiFe materials that are mostly used here for cost-related reasons, have a distinct hysteresis. That is, in such a core even without external magnetic field, a remnant magnetic flux is preserved whose strength depends on the previous history of the magnetic core. Previous history means the field strengths and field directions to which the core was exposed before the measurement in case of low currents.

In case of a current sensor illustrated in FIG. 1, thus even at zero primary current, this remanance causes a certain magnetic field on the probe and thus simulates a primary current for the current sensor where said primary current is not actually present. In case of low currents, this measurement error lies typically in the range of 50 and 100 mA if the current sensor has previously detected currents close to the upper measurement range limit or even beyond that. Measured error curves during the modulation of the current sensor to beyond the upper measurement range limit are illustrated in FIG. 2. This modulation drives the sensor core partly until saturation occurs and thus causes the strongest remanance when the primary current retracts to zero.

The measured curves illustrated in FIG. 2 are recorded using current sensors provided with an offset-free magnetic probe according to the patent application EP 0 294 590. However, they would occur in the similar fashion in case of current sensors provided with Hall IC as the magnetic field probe, if the offset of the Hall IC, which is generally considerably greater than the offset caused by the remanance of the magnetic core, is eliminated.

The remanance of the magnetic core thus in principle limits the measurement range of a closed loop sensor downwards.

Therefore, the current sensor used in the described battery management system of the Power Electronics Europe Magazine, issue Apr. 4, 2001 is provided with a two-level design. The battery current sensor illustrated schematically in FIG. 3 comprises an additional low current level 5 in addition to the closed loop sensor 1 to 3 that operates here as a high current level. This low current level is designed as a wound ring core made of amorphous soft-magnetic metal on the basis of the principle described in the patent application EP 0 960 342. It operates with alternating magnetic reversal, is thus offset-free and has a very high resolution in the range of small currents. Such sensors are however not suitable for measuring high currents, thus making the two-level design absolutely necessary. The disadvantage of this existing battery current sensor that technically meets all requirements is therefore this two-level design having two varying functional principles and that doubles both the expenditure of the magnetic module and also of the evaluation electronics.

Other solutions for a battery management sensor are exclusively based on a shunt resistance that is inserted into the battery current path together with the corresponding measurement and amplification of the voltage drop on this shunt resistance. However, this solution that initially appears to be impressive and simple, also has serious disadvantages: high currents cause a strong heating of the resistance that is additionally inserted into the circuit.

On the other hand, in case of low currents, the voltage drop to be measured is so low that the measurement can be easily disturbed by electromagnetic interferences, and that sufficient precision can be ensured only by using very expensive electronic circuits. This problem is further intensified when measuring the current on the plus side of the battery since the possible fluctuation of the reference potential with the battery voltage is greater than the voltage to be measured by several powers of ten. Therefore, these solutions require either very high electronic expenditure or they do not meet the requirements related to precision and interference resistance.

Another solution of the problem is feasible, which according to the schematic illustration in FIG. 4 consists of the combination of a shunt resistance and the low current sensor illustrated in FIG. 3. By using the magnetic measurement in case of small currents, it is possible to design the resistance value of the shunt to be lower. In this manner, the heating problems in case of high currents can also be reduced. In spite of that the voltage drop on the lower end of the shunt measurement range can still be kept higher by one to two orders of magnitude than in case of the exclusive use of a shunt. Therefore, the measurement is considerably fail-safe and requires low electronic expenditure.

Although this solution appears to be considerably cheaper than the previously described solution, it requires in addition to the magnetic measuring system, a special shunt that must be suitable for currents up to 1000 A or higher. Such shunts are integrated into a current bar using expensive joining methods and are therefore not particularly cost-effective. The current bar must be inserted into the circuit using screwed connections or welded connections. The use of an existing conductor piece by which additional connections in the circuit would have been avoided, is not possible.

SUMMARY

The object of the present invention is to specify a measuring arrangement and a measuring method for measuring currents with large dynamic range and particularly for detecting the battery current of a motor vehicle by meeting the afore-mentioned requirements in which the described disadvantages do not show up.

The object can be achieved by a measuring method for measuring currents with a large dynamic range by means of a magnetic measuring module that comprises a magnetic core with at least one compensation coil surrounding the core, an air gap, and a core opening, wherein a magnetic field probe is arranged in the air gap and a primary conductor conducting the current which is to be measured is guided through the core opening, the method comprising the step of switching into a high-current mode when a current threshold value is exceeded, and switching into a low-current mode otherwise, wherein the low-current mode comprises the steps of feeding a first current pulse to the compensation coil, which drives the magnetic core in a first direction until magnetic saturation occurs, measuring a first primary current value $I_1$ after the current pulse is disconnected, feeding a second current pulse to the compensation coil, which drives the magnetic core in a counter second direction until magnetic saturation occurs, measuring a second primary current value $I_2$ after the second current pulse is disconnected, and determining the corrected primary current value subsequently as an average value $I=(I_1+I_2)/2$ from the first and the second primary current values $I_1$, $I_2$.

In addition to the measurement of current using the magnetic module, a voltage drop between two distant points of the primary current conductor can be measured and evaluated as a measure for a current flowing through it. The current measurement by means of measuring the voltage drop during operation below the current threshold value can be calibrated by measuring the current with the magnetic module. The temperature of the primary conductor can be measured and the measurement of the current by means of measuring the voltage drop can be corrected by means of the temperature measurement. The high-current mode may comprises a current measurement according to the compensation principle. The high-current mode may comprises a current measurement according to the principle of voltage metering using a shunt resistance.

The object can also be achieved by a measuring arrangement for measuring currents with a large dynamic range by means of a magnetic measuring module that comprises a magnetic core with at least one compensation coil surrounding the core, an air gap and a core opening, wherein a magnetic field probe is arranged in the air gap and a primary conductor conducting the current which is to be measured is guided through the opening of the magnetic core, further comprising a trigger circuit and an evaluation circuit that switches into a high-current mode when a current threshold value is exceeded and switches into a low-current mode otherwise, wherein the measuring arrangement is operable in the low-current mode to feed a first current pulse to the compensation coil which drives the magnetic core in a first direction until magnetic saturation occurs, to measure a first primary current value $I_1$ after the current pulse is disconnected, to feed a second current pulse to the compensation coil which drives the magnetic core in a counter second direction until magnetic saturation occurs, to measure a second primary current value $I_2$ after the second current pulse is disconnected, and to determine the corrected primary current value subsequently as an average value $I=(I_1+I_2)/2$ from the first and the second primary current values $I_1$, $I_2$.

The primary current conductor may comprise contacts at certain distances on which a voltage drop on the primary current conductor is measured in addition to the current measurement with the magnetic module. The current measurement using the voltage drop during the operation of the measuring arrangement can be calibrated using the current measurement with the magnetic module.

A device for temperature measurement can be provided and the current measurement by measuring the voltage drop can be corrected by means of the temperature measurement. In addition to the first compensation coil, the magnetic module may comprise a second compensation coil that is connected in series to the first compensation coil and is wound on the magnetic core at a different location than the first compensation coil. The magnetic field probe may consist of a wound core made of a soft-magnetic amorphous metal. The magnetic field probe may consist of a wound core made of a soft-magnetic nanocrystalline metal. The trigger/evaluation circuit may comprise a microprocessor.

The advantage of the present invention is that only one single measuring element is required, that the current sensor for executing said measuring method can be manufactured extremely cost-effectively and that said current sensor is very flexible with respect to its integration into the circuit.

The present invention starts from the following considerations:

a) The most precise and fail-safe measuring method is the closed loop sensor as illustrated in FIG. 1. In addition, this current sensor can be manufactured very cost-effectively and can be mounted on current conductors of various forms using the separable magnetic core. Said current sensor therefore would be the ideal solution if the lower measurement range limit could be lowered distinctly below the 100 mA caused by the remanance of the magnetic core.

b) The demand on the temporal resolution of the measurement is very low in the low current range since integral current flows must essentially be detected over long periods of time. Bandwidths of far below 1 Hz are therefore easily acceptable.

c) A simple microprocessor is provided in a self-contained measuring module only for operating the digital interface (CAN bus). This microprocessor can be used at no additional costs for simple control and calculation functions associated with the current measurement. In case of a solution integrated into a control unit, such functions are no problem at all.

The measuring method according to the present invention for measuring currents with large dynamic range uses a magnetic measuring module that comprises a magnetic core provided with at least one compensation coil surrounding said core in addition to an air gap and a core opening. A magnetic field probe is arranged in the air gap and a primary conductor conducting the current to be measured is guided through the opening of the magnetic core. The measuring method comprises the following steps:

Switching into a high-current mode when a current threshold value is exceeded, and switching into a low-current mode when a current threshold value is not respected. The low-current mode comprises the following steps:

A first current pulse is placed on the compensation coil, which drives the magnetic core in a first direction until magnetic saturation occurs, A first primary current value $I_1$ is measured after the current pulse is disconnected, A second current pulse is placed on the compensation coil, which drives the magnetic core in a counter second direction until magnetic saturation occurs, A second primary current value $I_2$ is measured after the second current pulse is disconnected.

The corrected primary current value is subsequently determined as an average value $I=(I_1+I_2)/2$ from the first and the second primary current values $I_1$, $I_2$.

In addition to the current measurement using the magnetic module, the voltage drop between two distant points of the primary current conductor can be measured and evaluated as a measure for the current flowing though it.

The current measurement by means of a measurement of the voltage drop during the operation below the current threshold value is preferably calibrated by the current measurement using the magnetic module.

Alternatively or additionally, it is also possible to measure the temperature of the primary conductor and to correct the current measurement by measuring the voltage drop by means of the temperature measurement.

Finally, the high current mode can contain a current measurement according to the compensation principle and/or a current measurement according to the principle of voltage metering using a shunt resistance.

The measuring device for executing the method according to the present invention comprises a magnetic measuring module that comprises a magnetic core provided with at least one compensation coil surrounding said core, in addition to an air gap and a core opening, whereby a magnetic field probe is arranged in the air gap and a primary conductor conducting the current to be measured is guided through the opening of the magnetic core. Furthermore, a trigger circuit and evaluation unit is provided that switches into a high-current mode when a current threshold value is exceeded and switches into a low-current mode when a current threshold value is not respected. Said low-current mode is comprised of the steps described above in more detail.

In the measuring device according to the present invention, the primary current conductor can comprise of contacts arranged at certain distances on which the voltage drop on the primary current conductor is measured in addition to the current measurement using the magnetic measuring module.

The current measurement using the voltage drop can be calibrated by the current measurement using the magnetic module.

Furthermore, a device for measuring the temperature can be provided whereby the current measurement by measuring the voltage drop is corrected by means of the temperature measurement.

Moreover, the magnetic module can comprise a second compensation coil in addition to the first compensation coil. Said second compensation coil is connected in series to the first compensation coil and is wound on the magnetic core at a different point than the first compensation coil.

The magnetic field probe can consist of a wound core made of a soft-magnetic nanocrystalline or amorphous metal.

Finally, the trigger/evaluation circuit that is connected at least between the magnetic field probe and the compensation coil preferably comprises a microprocessor.

BRIEF DESCRIPTION OF THE DRAWINGS

The present invention is explained more elaborately on the basis of the embodiments illustrated in the figures of the drawing where like elements are provided with like reference numerals. The drawing illustrates.

DETAILED DESCRIPTION

The present invention according to FIG. 5 is based on the use of a closed loop sensor that operates above a limit of e.g. 1 A in its normal operating mode. If the current to be measured drops below this limit, the evaluation electronics 9 which comprise the evaluation circuit 10 and the trigger circuit 11 switch into a low-current mode. In this mode, every measuring point is determined by the following sequence, which is illustrated schematically in FIG. 5:

a) The measuring method starts in point A in case of a random offset value that depends on the previous history of the sensor and/or magnetic core;

b) A first current pulse is placed on the compensation coil 3, which drives the magnetic core beyond a value B in a direction until magnetic saturation occurs;

c) A first primary current value $I_1$ is measured after the current pulse is disconnected;

d) A second current pulse is placed on the compensation coil 3, which drives the magnetic core beyond a value C in a counter direction until magnetic saturation occurs;

e) A second primary current value $I_2$ is measured after the second current pulse is disconnected;

f) Finally, the corrected primary current value is determined as an average value $I=(I_1+I_2)/2$ from the first and the second primary current values $I_1$, $I_2$.

Figure 1:
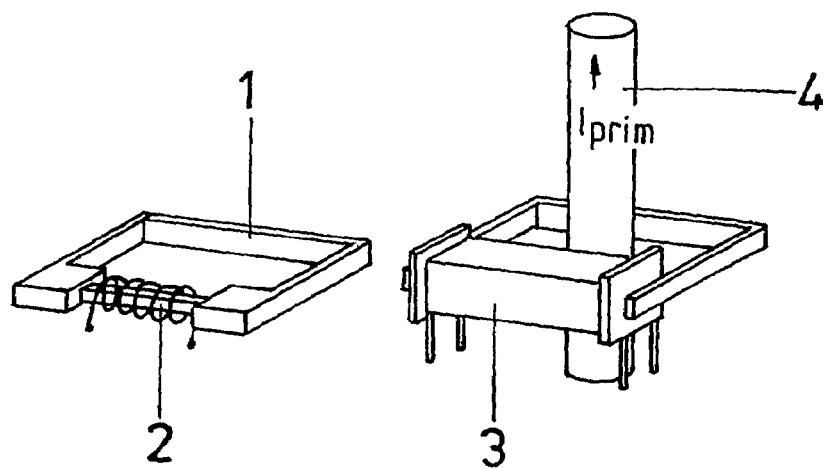
FIG. 1 the typical design of a closed loop sensor according to prior art.
Figure 3:
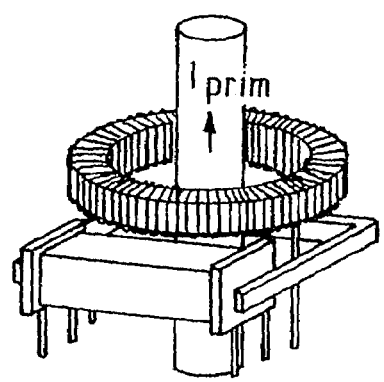
Figure 4:
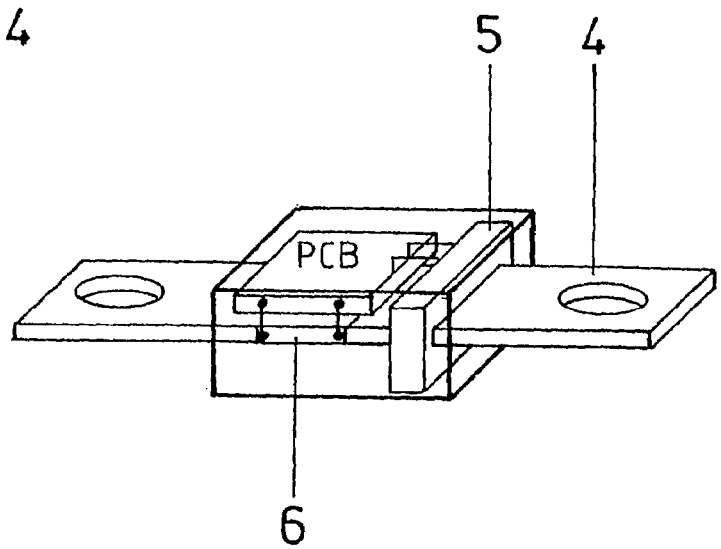
Figure 2:
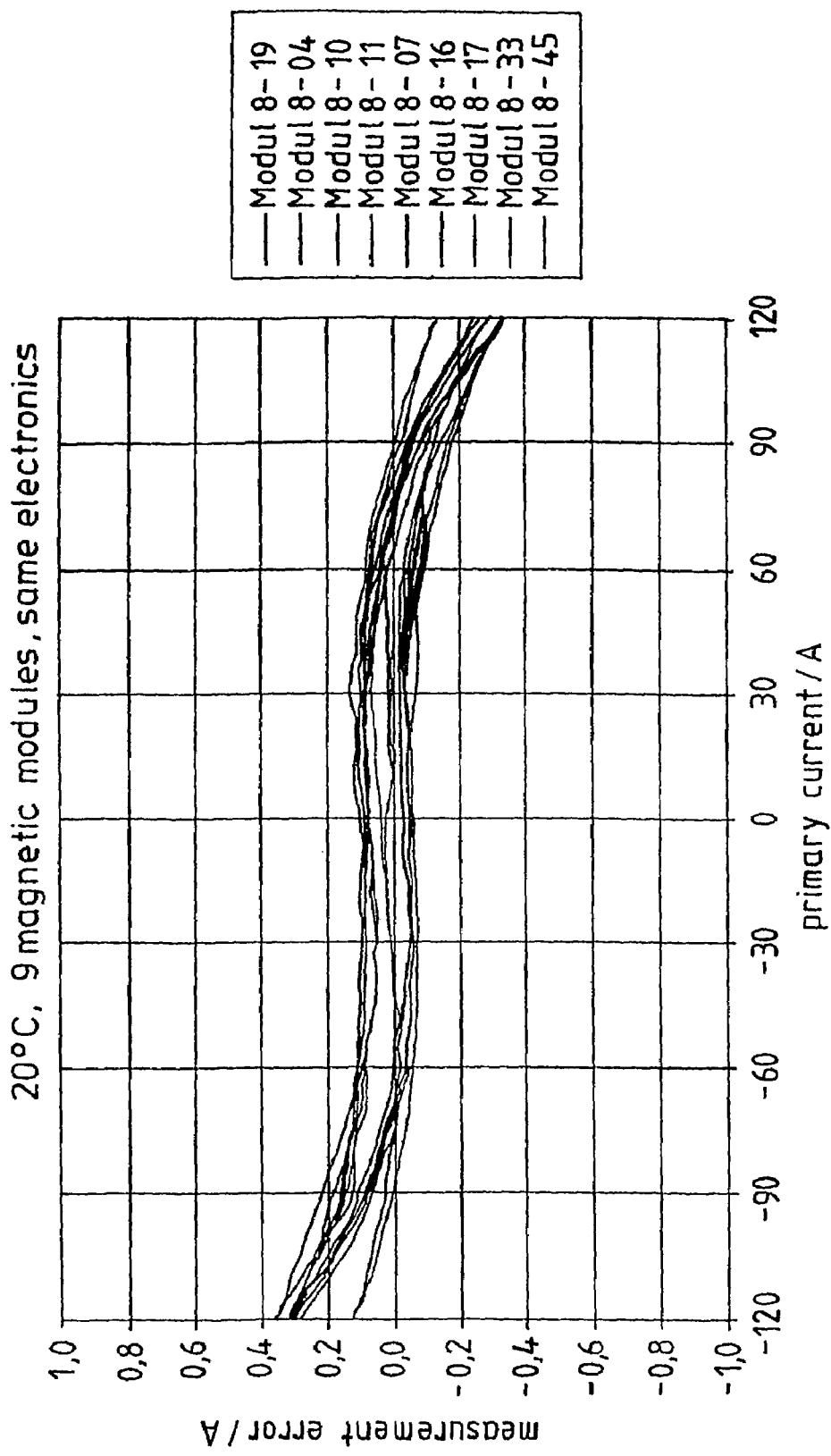
FIG. 2 typical error curves of current sensors illustrated in FIG. 1 provided that the magnetic field probe has no offset, FIG. 3 the design of a two-level current sensor for measuring the battery current according to prior art, FIG. 4 the design of a two-level current sensor for measuring the battery current according to prior art, FIG. 5 a measuring module and a measuring method for the low-current range according to the present invention, FIG. 6 measurement results on a measuring module illustrated in FIG. 1 using the measuring method according to the present invention, FIG. 7 a measuring module provided with two compensation coils and a corresponding measuring method for the low current range according to the present invention, FIG. 8 a measuring module provided with two compensation coils as well as a voltage tap on the primary conductor and a corresponding measuring method for the low current range according to the present invention.
Figure 8:
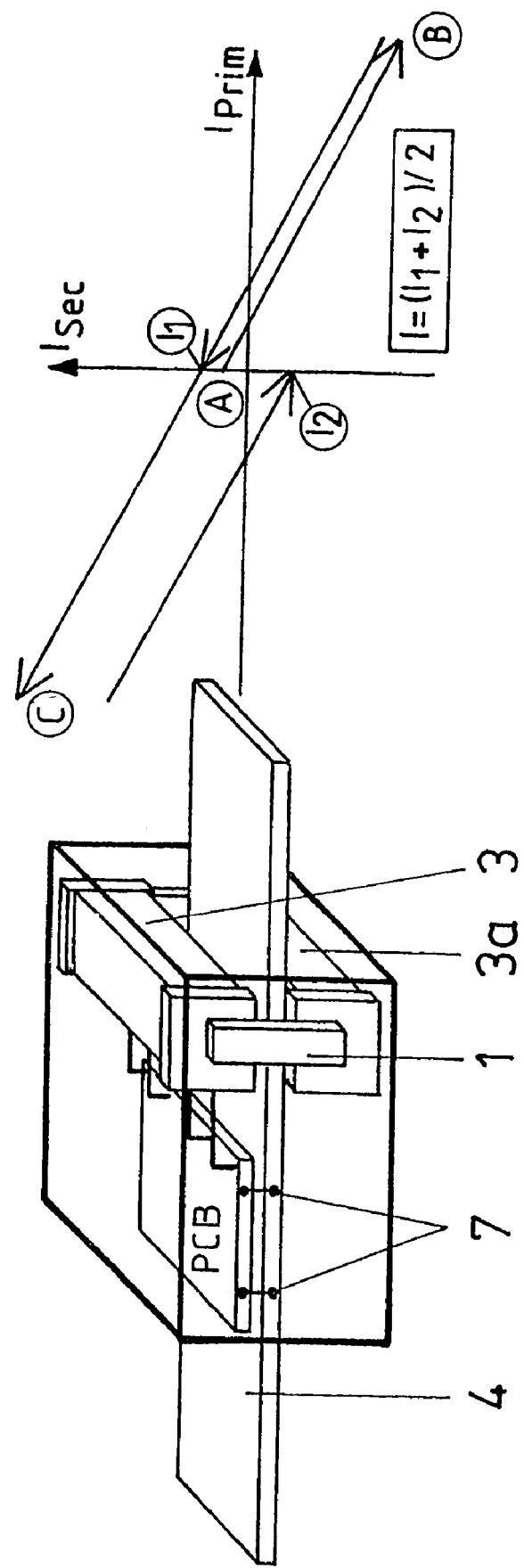

The mode of operation of this method is evident from the error curve illustrated in FIG. 2. The hysteresis curve is symmetrical. That is, if the magnetic core was in positive saturation before the recording of the measuring value, the additional current value simulated by the remanance of the magnetic core is according to amount exactly as large as it would be if the magnetic core was in negative saturation before the recording of the measuring value. Thus the average value yields the true current value.

Initial measuring results on a measuring module illustrated in FIG. 5 using the algorithm according to the present invention are shown in FIG. 6. Without additional optimization, the lower measurement range limit can be lowered to approx. 15 mA. This is sufficient for several applications.

The cause for the apparent current value of 10 to 15 mA remaining following this method is that the magnetic core cannot randomly guide the magnetic flux supplied to the compensation coil properly. Instead, the magnetic core loses leakage flux. Saturation effects initially occur in the regions of the magnetic core that lie close to the coil. Particularly the regions of the magnetic core that lie opposite to the coil are not completely reached by the current pulse and thus not completely saturated. In these regions that are not completely saturated, the magnetic core retains its memory of the previous history.

An arrangement illustrated in FIG. 7 provides the remedy to this situation in another embodiment of the present invention. Said arrangement is provided with a second compensation coil 3a, which is connected in series to the first compensation coil 3 below which the magnetic field probe 2 is located. The compensation current thus flows through both the coils in the similar direction. Thus it is possible for the magnetic core to drive through the current pulse more evenly into saturation and the effect of the measuring method described above is thus optimized.

The arrangement illustrated in FIG. 7 with two compensation coils also has another advantage: the measurement range of the sensor illustrated in FIG. 5 is limited to approx. 100 A when using very simple and cost-effective components. Beyond this measurement range, and also due to leakage flux effects, the magnetic core begins to saturate partly, due to which the measurement characteristics are strongly non-linear.

This effect is also prevented by the second compensation coil so that the measurement range can be extended to almost double the measurement range of a sensor provided with only one compensation coil and other similar components.

Such a current sensor can indeed be designed by appropriately dimensioning the components to a measurement range of 400 to 600 A or even beyond that. However, this is not practical for cost reasons and due to the associated increasing overall size. The components would have to be designed in a complex and expensive manner. Furthermore, the evaluation electronics would have to drive very high compensation currents, which in turn increases the costs of the electronics. Therefore a measurement range of 100 to 130 A is considered to be more practical for a sensor provided with one compensation coil and a measurement range of approx. 200 A is more practical for a sensor provided with two compensation coils.

Currents above these measurement ranges mostly must be detected only with lower precision. What proves to be suitable for this purpose is the measurement of the voltage drop directly on the primary conductor that consists essentially of copper. In case of such high currents, the voltage drop of more than 1 to 2 cm. on the copper bar is so high that it can be evaluated without any problems.

Since the geometry of the copper bar and of the contacting is subjected to certain tolerances and since normal copper has a very high temperature dependence of the electrical resistance of approx. 40% at 100° temperature difference, this measurement must be calibrated. This can take place during the measurement with the magnetic sensor within its measurement range by comparing the values of the current sensor with the values determined from the measurement of the voltage drop. The closed loop sensors described here are so fast that even when the current rises quickly during the start-up process, there remains enough time for such a calibration process.

An additional or alternative calibration of the measurement of the voltage drop on the primary current conductor is also possible by means of a temperature measurement. The temperature is also an important measured variable for determining the battery parameters. Therefore, the temperature measurement is also integrated in many measuring modules. The measured temperature value can be used for correcting the voltage drop on the current bar in order to determine the true current value.

What we claim is:

1. A measuring method for measuring currents with a large dynamic range by means of a magnetic measuring module that comprises a magnetic core with at least one compensation coil surrounding said core, an air gap, and a core opening, wherein a magnetic field probe is arranged in the air gap and a primary conductor conducting the current which is to be measured is guided through the core opening, the method comprising the following steps:
    Switching into a high-current mode when a current threshold value is exceeded, and switching into a low-current mode otherwise, wherein the low-current mode comprises the following steps:
    Feeding a first current pulse to the compensation coil, which drives the magnetic core in a first direction until magnetic saturation occurs,
    Measuring a first primary current value $I_1$ after the current pulse is disconnected,
    Feeding a second current pulse to the compensation coil, which drives the magnetic core in a counter second direction until magnetic saturation occurs,
    Measuring a second primary current value $I_2$ after the second current pulse is disconnected, and
    Determining the corrected primary current value subsequently as an average value $I=(I_1+I_2)/2$ from the first and the second primary current values $I_1$, $I_2$.

2. A measuring method according to claim 1, wherein in addition to the measurement of current using the magnetic module, a voltage drop between two distant points of the primary current conductor is measured and evaluated as a measure for a current flowing through it.

3. A measuring method according to claim 2, wherein the current measurement by means of measuring the voltage drop during operation below the current threshold value is calibrated by measuring the current with the magnetic module.

4. A measuring method according to claim 2, wherein the temperature of the primary conductor is measured and the measurement of the current by means of measuring the voltage drop is corrected by means of the temperature measurement.

5. A measuring method according to claim 1, wherein the high-current mode comprises a current measurement according to the compensation principle.

6. A measuring method according to claim 1, wherein the high-current mode comprises a current measurement according to the principle of voltage metering using a shunt resistance.

7. A measuring arrangement for measuring currents with a large dynamic range by means of a magnetic measuring module that comprises a magnetic core with at least one compensation coil surrounding said core, an air gap and a core opening, wherein a magnetic field probe is arranged in the air gap and a primary conductor conducting the current which is to be measured is guided through the opening of the magnetic core, further comprising a trigger circuit and an evaluation circuit that switches into a high-current mode when a current threshold value is exceeded and switches into a low-current mode otherwise, wherein the measuring arrangement is operable in the low-current mode to feed a first current pulse to the compensation coil which drives the magnetic core in a first direction until magnetic saturation occurs, to measure a first primary current value $I_1$ after the current pulse is disconnected, to feed a second current pulse to the compensation coil which drives the magnetic core in a counter second direction until magnetic saturation occurs, to measure a second primary current value $I_2$ after the second current pulse is disconnected, and to determine the corrected primary current value subsequently as an average value $I=(I_1+I_2)/2$ from the first and the second primary current values $I_1$, $I_2$.

8. A measuring arrangement according to claim 7, wherein the primary current conductor comprises contacts at certain distances on which a voltage drop on the primary current conductor is measured in addition to the current measurement with the magnetic module.

9. A measuring arrangement according to claim 8, wherein the current measurement using the voltage drop during the operation of the measuring arrangement is calibrated using the current measurement with the magnetic module.

10. A measuring arrangement according to claim 8, comprising a device for temperature measurement, wherein the current measurement by measuring the voltage drop is corrected by means of the temperature measurement.

11. A measuring arrangement according to claim 7, wherein in addition to the first compensation coil, the magnetic module comprises a second compensation coil that is connected in series to the first compensation coil and is wound on the magnetic core at a different location than the first compensation coil.

12. A measuring arrangement according to claim 7, wherein the magnetic field probe consists of a wound core made of a soft-magnetic amorphous metal.

13. A measuring arrangement according to claim 7, wherein the magnetic field probe consists of a wound core made of a soft-magnetic nanocrystalline metal.

14. A measuring arrangement according to claim 7, wherein the trigger/evaluation circuit comprises a microprocessor.

15. A measuring arrangement for measuring currents with a large dynamic range by means of a magnetic measuring module that comprises a magnetic core having an air gap with at least one compensation coil surrounding the air gap and a core opening, wherein a magnetic field probe is arranged in the air gap and a primary conductor conducting the current which is to be measured is guided through the opening of the magnetic core, further comprising a trigger circuit and an evaluation circuit that switches into a high-current mode when a current threshold value is exceeded and switches into a low-current mode otherwise, wherein the measuring arrangement is operable in the low-current mode to feed a first current pulse to the compensation coil which drives the magnetic core in a first direction until magnetic saturation occurs, to measure a first primary current value $I_1$ after the current pulse is disconnected, to feed a second current pulse to the compensation coil which drives the magnetic core in a counter second direction until magnetic saturation occurs, to measure a second primary current value $I_2$ after the second current pulse is disconnected, and to determine the corrected primary current value subsequently as an average value $I=(I_1+I_2)/2$ from the first and the second primary current values $I_1$, $I_2$.

16. A measuring arrangement according to claim 15, wherein the primary current conductor comprises contacts at certain distances on which a voltage drop on the primary current conductor is measured in addition to the current measurement with the magnetic module.

17. A measuring arrangement according to claim 16, wherein the current measurement using the voltage drop during the operation of the measuring arrangement is calibrated using the current measurement with the magnetic module.

18. A measuring arrangement according to claim 16, comprising a device for temperature measurement, wherein the current measurement by measuring the voltage drop is corrected by means of the temperature measurement.

19. A measuring arrangement according to claim 15, wherein in addition to the first compensation coil, the magnetic module comprises a second compensation coil that is connected in series to the first compensation coil and is wound on the magnetic core at a different location than the first compensation coil.

20. A measuring arrangement according to claim 15, wherein the magnetic field probe consists of a wound core made of a soft-magnetic amorphous metal.

* * * * *